(12) United States Patent
Moulzolf et al.

(10) Patent No.: US 9,850,932 B2
(45) Date of Patent: Dec. 26, 2017

(54) METHOD FOR RETAINING A DEVICE TO A SUBSTRATE

(75) Inventors: Scott Moulzolf, Bangor, ME (US); Alberto Canabal, Apopka, FL (US); Thomas Moonlight, Dover-Foxcroft, ME (US); Mauricio Pereira Da Cunha, Orono, ME (US); George Harris, Auburn, ME (US)

(73) Assignee: UNIVERSITY OF MAINE SYSTEM BOARD OF TRUSTEES, Bangor, ME (US)

( * ) Notice: Subject to any disclaimer, the term of this patent is extended or adjusted under 35 U.S.C. 154(b) by 0 days.

(21) Appl. No.: 13/583,744

(22) PCT Filed: Mar. 9, 2011

(86) PCT No.: PCT/US2011/027732
§ 371 (c)(1),
(2), (4) Date: Sep. 10, 2012

(87) PCT Pub. No.: WO2011/112707
PCT Pub. Date: Sep. 15, 2011

(65) Prior Publication Data
US 2013/0000098 A1  Jan. 3, 2013

Related U.S. Application Data

(60) Provisional application No. 61/312,471, filed on Mar. 10, 2010.

(51) Int. Cl.
*H05K 3/30* (2006.01)
*F16B 11/00* (2006.01)
(Continued)

(52) U.S. Cl.
CPC .......... *F16B 11/006* (2013.01); *B81B 7/0048* (2013.01); *H01L 24/90* (2013.01);
(Continued)

(58) Field of Classification Search
CPC .......... H01L 2924/01079; H01L 24/90; F16B 11/006; B81B 7/0048
(Continued)

(56) References Cited

U.S. PATENT DOCUMENTS 5,650,913 A * 7/1997 Kochanski ............ 361/704
5,909,358 A * 6/1999 Bradt .................... 361/707
(Continued)

FOREIGN PATENT DOCUMENTS

DE  102007010711 A1  9/2008
EP     1145612 A2    10/2001

OTHER PUBLICATIONS

International Preliminary Report on Patentability for PCT/US2011/027732, dated Sep. 20, 2012.
(Continued)

*Primary Examiner* — Paul D Kim
(74) *Attorney, Agent, or Firm* — Choate, Hall & Stewart LLP

(57) ABSTRACT

Methods and systems for attaching a device to a substrate for operation of the device under variable conditions includes attaching a device to a substrate, disposing a removable material over a first portion of the device, positioning a second portion of the device adjacent to the substrate, operably attaching a retainer to the substrate adjacent to the device with a part of the retainer disposed over the removable material, and removing the removable material to form a gap between the device and the retainer so that the device is retained on the substrate, and wherein the gap allows the device to move freely relative to the retainer and the substrate in response to changes in temperature.

20 Claims, 8 Drawing Sheets

(51) Int. Cl.
*H01L 23/00* (2006.01)
*B81B 7/00* (2006.01)

(52) U.S. Cl.
CPC .. *H01L 2924/1306* (2013.01); *H01L 2924/14* (2013.01); *Y10T 29/49826* (2015.01); *Y10T 29/53961* (2015.01)

(58) Field of Classification Search
USPC .......................................................... 29/832
See application file for complete search history.

(56) References Cited

U.S. PATENT DOCUMENTS

| | | | |
|---|---|---|---|
| 5,943,555 A | | 8/1999 | Shiomi et al. |
| 6,259,602 B1 * | | 7/2001 | Malhammar ................. 361/704 |
| 6,617,685 B1 * | | 9/2003 | Bollesen ...................... 257/719 |
| 8,766,426 B2 * | | 7/2014 | Goh et al. .................... 257/690 |
| 2005/0178002 A1 * | | 8/2005 | Maeno ........................... 29/840 |
| 2006/0151203 A1 * | | 7/2006 | Krueger et al. .............. 174/260 |
| 2008/0118721 A1 * | | 5/2008 | Horie et al. ................. 428/209 |

OTHER PUBLICATIONS

Extended European Search Report for 11754003.9, 7 pages (Aug. 25, 2014).
International Search Report for PCT/US2011/027732, 3 pages (Nov. 8, 2011).
Written Opinion of PCT/US2011/027732, 3 pages (Nov. 8, 2011).

\* cited by examiner

METHOD FOR RETAINING A DEVICE TO A SUBSTRATE

CROSS-REFERENCE TO RELATED APPLICATION

This application claims priority under 35 U.S.C. §119 to U.S. Provisional Application No. 61/312,471, filed Mar. 10, 2010, which is herein incorporated by reference in its entirety.

STATEMENT REGARDING FEDERALLY SPONSORED RESEARCH OR DEVELOPMENT

This invention was made with Government support under Universal Technology Corporation Prime Contract: F33615-03-D-5204, Task Order 0035; Program: Nondestructive Evaluation Technology Initiatives Program II (NTIP II) Air Force Research Laboratories "Sensing Technologies for Harsh Environments". The U.S. Government has certain rights in the invention.

TECHNICAL FIELD

The present invention generally relates to methods and systems for attaching a device to a substrate and, in particular, to methods and systems for attaching a device to a substrate such that the device can operate under variable, and potentially harsh, conditions without becoming dislodged from the substrate.

BACKGROUND OF THE INVENTION

The attachment of devices to substrates is a method used in virtually every industry. One industry in which such methods are widely used is in the field of communications and control systems, including the attachment of sensors.

Included among such devices are active components such as transistors, field effect transistors (FET's), application specific integrated circuits (ASIC), microprocessors and passive components such as resistors, inductors and capacitors. The devices also include specialized items, for example, surface acoustic wave (SAW) devices. The devices are conventionally attached directly to the substrate. For example, SAW devices are directly attached to the surfaces of jet engines, to helicopter rotor blades, or to static parts of an engine. However, direct attachment often leads to performance degradation, or even outright failure of the attached device when used in variable conditions such as conditions of high temperature variation.

There is a need for methods and systems for mounting devices upon substrates that accommodate harsh conditions found in certain applications, such as high temperature conditions, including large variations in temperature.

SUMMARY OF THE INVENTION

The present invention provides, in a first aspect, a method for attaching a device to a substrate. The method comprises disposing a removable material over a first portion of the device, positioning a second portion of the device adjacent to the substrate, operably attaching a retainer to the substrate adjacent to the device with a part of the retainer disposed over the removable material, and removing the removable material to form a gap between the device and at least one of the substrate and the retainer so that the device is movably retained on the substrate and wherein the gap allows the device to move freely relative to the retainer and the substrate in response to changes in temperature.

The present invention provides, in a second aspect, a system for attaching a device to a substrate. The system comprises the device, and a retainer operably attachable to the substrate and spaced apart from the device to define a gap so that the device is movably retained on the substrate between said retainer and the substrate and wherein the gap exists between said device and at least one of the substrate and said retainer such that said device is allowed to move freely relative to said retainer and the substrate in response to changes in temperature.

The present invention provides, in a third aspect, a method for attaching a device to a substrate. The method comprises providing the device having a first portion and a second portion, positioning a second portion of the device adjacent to the substrate, operably attaching a retainer to the substrate adjacent to the device with a part of the retainer disposed over the first portion of said device to form a gap between the device and at least one of the retainers and the substrate such that the device is movably retained on the substrate, and wherein the gap allows the device to move freely relative to the retainer and the substrate in response to changes in temperature.

The present invention provides, in a fourth aspect, a system for attaching a device to a substrate, the system comprising the device and a retainer operably attachable to the substrate with a part of the retainer disposed over a portion of the device to define a gap between the device and at least one of the retainers and the substrate such that said device is retained on the substrate between said retainer and the substrate, and the substrate having one of a greater coefficient of thermal expansion than the coefficient of thermal expansion of said device and a smaller coefficient of thermal expansion than the coefficient of thermal expansion of said device, and wherein the gap allows said device to move freely relative to said retainer and the substrate in response to changes in temperature.

The present invention provides, in a fifth aspect, a system for attaching a device to a substrate. The system comprises the device, and a retaining means attachable to the substrate for defining a gap so that the device is retained on the substrate between the retainer and the substrate and wherein the gap allows the device to move freely relative to the retainer and the substrate in response to changes in temperature.

These and other objects, features and advantages of this invention will become apparent from the following detailed description of the various aspects of the invention taken in conjunction with the accompanying drawings.

DETAILED DESCRIPTION OF THE INVENTION

The present invention is generally directed to methods and systems for attaching a device to a substrate such that the device may operate under variable conditions, such as high temperature conditions, wherein the device and substrate have different coefficients of thermal expansion, and which desirably avoids performance degradation, or even outright failure of the device in an environment with large temperature variations as described in greater detail below.

Figure 1:
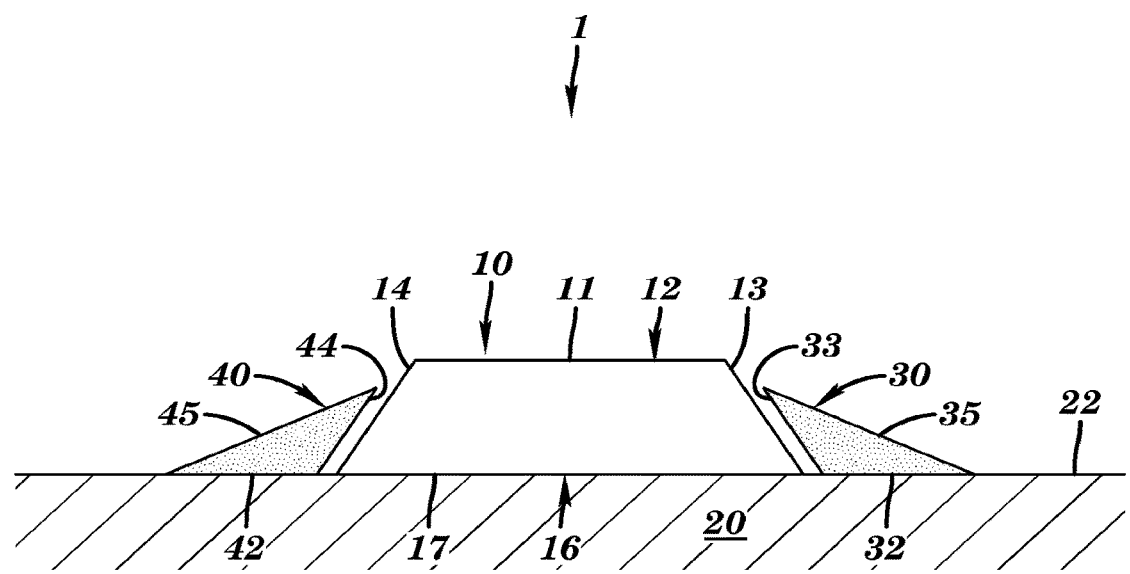
FIG. 1 is a side elevational view, in part cross-section, of one embodiment of a device movably attached to a substrate in accordance with an aspect of the present invention.

FIG. 1 illustrates one embodiment of a system 1 for movably attaching a device 10, for example, an electronic device such as a surface acoustic wave device, to a substrate 20 such as static and/or movable surfaces, for example, portions of jet engines, helicopter rotor blades, static engine parts, or other surfaces in accordance with an aspect of the present invention.

In this illustrated embodiment, device 10 includes a first or upper portion 12 having, for example, two beveled surfaces, and a second or lower portion 16. Second portion 16 of the device may have a lower surface 17 which is in contact or positioned adjacent to a surface 22 of substrate 20. Retainers 30 and 40 are operably attached to the substrate with at least a part of the retainer disposed over the device. For example, retainers 30 and 40 may include inner surfaces 33 and 44 disposed substantially parallel to the beveled surfaces of the device. Lower surfaces 32 and 42 of the retainers may be in contact with or attached to surface 22 of substrate 20 or operably attached to substrate 20. The retainers may also include outer surfaces 35 and 45 that extend from the top of the inner surfaces to the substrate. In addition, an outer surface 11 of the device may not be covered by portions of the retainers, and thus, exposed to the ambient environment above the substrate.

Disposed between device 10 and retainers 30 and 40 are gaps 50 and 60, for example, disposed between the outer surfaces 13 and 14 such as between the beveled edges of the device and inner surfaces 33 and 44 of the retainers.

As will be appreciated from the above description, device 10 is movably retained between the inner surfaces of retainers 30 and 40 and the surface of the substrate. For example, gaps 50 and 60 allow the device to freely expand relative to the retainers in response to changes in temperature without being constrained by the retainers, thereby reducing or potentially eliminating thermal expansion stresses between the device, the substrate, and/or the retainers.

Figure 2:
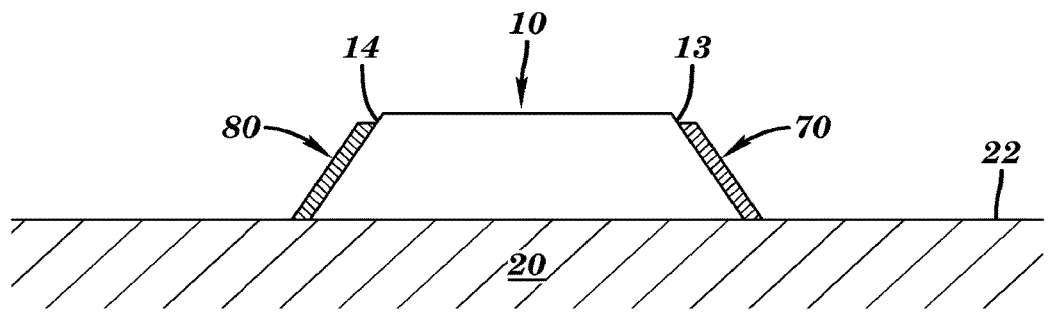
FIG. 2 is a side elevational view, in part cross-section, of an intermediate structure of the device and substrate of FIG. 1, and removable materials, in accordance with an aspect of the present invention.
Figure 3:
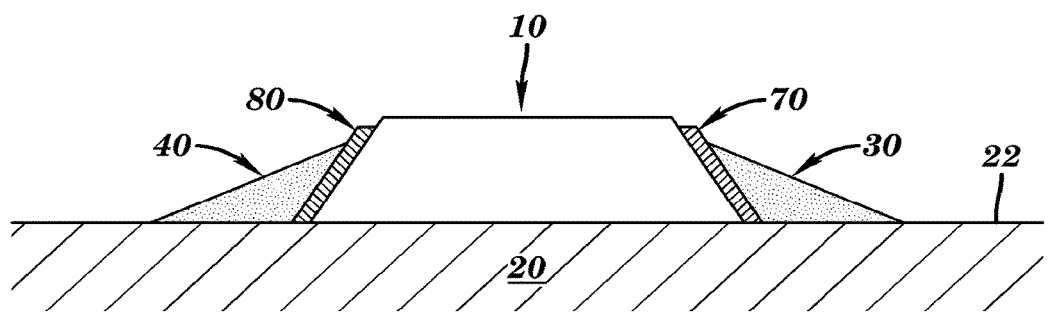
FIG. 3 is a side elevational view, in part cross-section, of the intermediate structure of the device and removable materials of FIG. 2, along with two retainers in accordance with an aspect of the present invention.

FIGS. 2 and 3 diagrammatically illustrate intermediate embodiments for movably attaching device 10 to substrate 20 in accordance with an aspect of the present invention.

With reference to FIG. 2, device 10 is placed or positioned on surface 22 of substrate 20. Removable material 70 and 80, such as relatively thin layers, are introduced, each of which is disposed over, for example, outer surfaces 13 and 14 of device. As shown in FIG. 3, retainers 30 and 40 are then installed for example, abutting the removable material and the substrate. With removal of the removable material as described below, the gaps are formed between the retainers and the device as shown in FIG. 1.

The removable material may comprise any application-appropriate material including, but not limited to, thermally removable material such as shellac, polytetrafluoroethylene (PTFE), a photoresist, or superglue, as well as any other compound that may be removed using either thermal or chemical means without concurrently removing the retainer, for example, burning the removable material. The removable material may be of varying thickness, such as between about 1 micrometer to about 400 micrometers ($\mu$m), or between about 1 $\mu$m and about 10 $\mu$m, though thicknesses outside this range are also contemplated as within the scope of the present invention. Additionally, in certain embodiments, the device may have rough surfaces (e.g. not optically polished surfaces) and thus there may be a plurality of protuberances and depressions. Thus, the thickness may vary over the entire surface and the term "thickness" as used herein may refer to an "average thickness" of the layer as a whole. In addition, the gaps formed due to the removal of the removable material generally have a thickness of about 1 $\mu$m to about 400 $\mu$m, and between 1 $\mu$m and 10 $\mu$m.

The retainers may take a variety of forms, depending upon the desired application, including, for example, a securing material such as an adhesive or a thermoset, such as epoxy. The shape of the retainers may vary as the angle or shape of the device varies and may vary independently, depending upon the specific application for which the invention is being used. For example, the retainers may be an epoxy and may be applied in such a way as to form triangles, as shown in FIGS. 1 and 3. Alternatively, for certain embodiments, the retainers may be applied in other fashions such that the ability of the device to function for a particular application is not inhibited, including the thermal spraying of, for example, a metal or ceramic material. It will be appreciated that for certain embodiments, the retainers will be formed such that a surface of the retainer is at an angle E relative to the surface of the substrate, with $0°<E<90°$, in order to facilitate securing the device to the substrate via the retainers.

In the case of the retainers being epoxy, the epoxy will typically be made to cure or harden before the removable material is removed. Regardless of the form of the retainer(s), they are desirably disposed over portions of the device, and, according to certain embodiments, the removable material(s). It will be appreciated that the retainers will preferably not be present between the device and the substrate.

Figure 4:
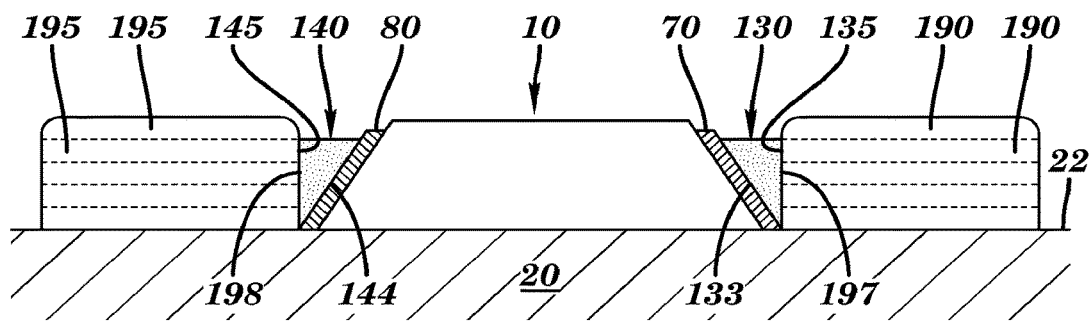
FIG. 4 is a side elevational view, in part cross-section, of another embodiment of an intermediate structure for movably attaching a device to a substrate in accordance with an aspect of the present invention.

FIG. 4 illustrates another embodiment of an intermediate structure for movably attaching a device 10 to a substrate 20 in accordance with an aspect of the present invention. In this illustrated embodiment, a plurality of layers 190 and 195, such as relatively thick layers, may be attached to or sequentially deposited on substrate 20 around or adjacent to the device. It will be appreciated that the layers may be disposed on the substrate to define a cavity and the device then placed in the cavity. Removable material 70 and 80 is disposed on the device, for example, as described above. Retainers 130 and 140 are disposed over removable material such that inner edges 133 and 143 are in contact with the removable material, and outer surfaces 135 and 145 of the retainers are in contact with layers 190 and 195, such that retainers are operably attached to the layers 190 and 195.

It will be appreciated that the layers 190 and 195 may be spaced-apart from the device such that the retainers include a lower portion that may be in contact with surface 22 of substrate 20 while the inner surface 133 and 144 are in contact with the removable material and outer surfaces 135 and 145 are in contact with the thick layers 190 and 195.

Layers 190 and 195 may be made from any application-appropriate material including, but not limited to, metals, metal alloys, metal oxides, plastics, a glassy material, or ceramic materials. Several embodiments of the invention may include layers made of the same material as the substrate. Layers may be pre-formed and attached to substrate, or they may be applied to the substrate directly, for example, through spraying. Other examples of acceptable methods for depositing layers include spray pyrolisis, photolithography, electrodeposition, and screen printing. It will also be appreciated that instead of a plurality of layers, a single layer may be disposed and operably attached on the substrate, for example, having a thickness about the height of the device.

Figure 5:
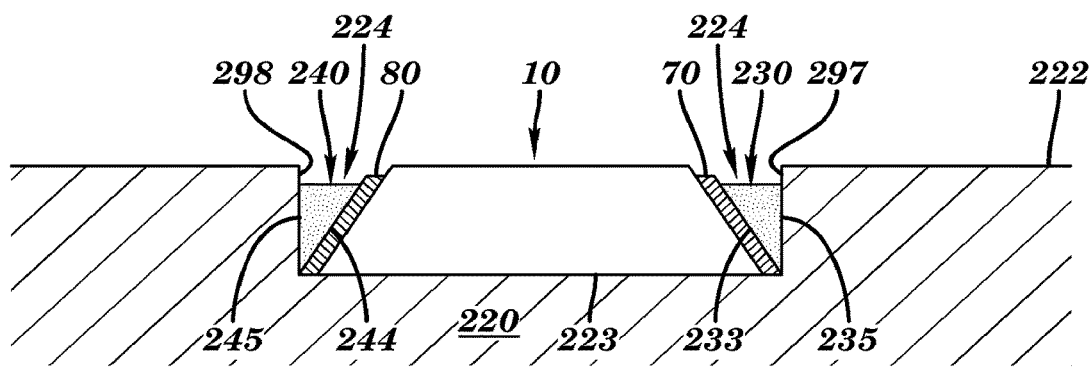
FIG. 5 is a side elevational view, in part cross-section, of another embodiment of an intermediate structure for movably attaching a device to a substrate in accordance with an aspect of the present invention.

FIG. 5 illustrates another embodiment of an intermediate structure for movably attaching a device 10 to a substrate 220 in accordance with an aspect of the present invention. In this illustrated embodiment, substrate 220 includes a depression or cavity 224 defining a surface 223 disposed below an outer surface 222. Sidewalls 297 and 298 include surfaces that extend from surface 232 to surface 222. The device is then placed on surface 223, having removable material 70 and 80 thereon and then retainers 230 and 240 located and/or installed. Retainers may be attached such that inner surfaces 233 and 244 are contacting removable material while outer surfaces 235 and 245 are contacting surfaces 297 and 298 of substrate 220. The depression 224 may be of width, depth or configuration such that retainers may contact multiple surfaces of the substrate, as well as, the removable material. The depression or cavity may have a variety of configurations including a square, a rectangle, a circle or portion thereof, an oval or any other application-appropriate configuration. The cavity may include sidewalls that are spaced-apart from the device such that retainers include a portion that is in contact with a lower surface of the substrate while the inner surfaces are in contact with the removable material and outer surfaces are in contact with the sidewalls.

Figure 6:
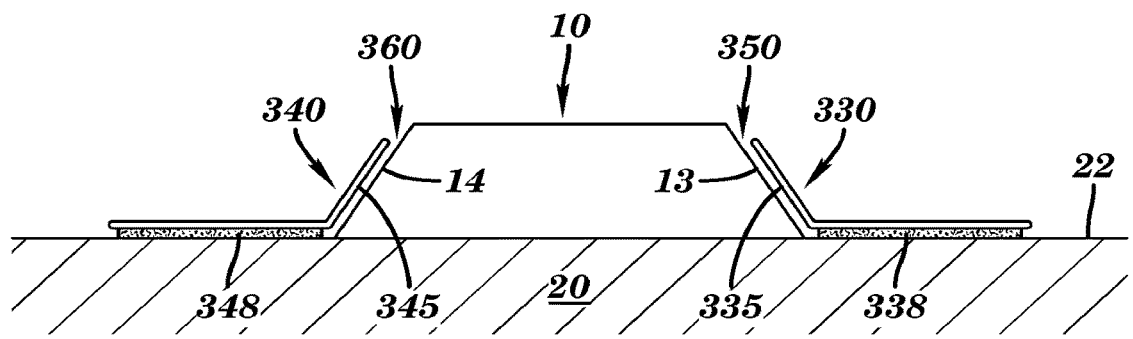
FIG. 6 is a side elevational view, in part cross-section, of another embodiment of the device of FIG. 2 and two alternate retainers in accordance with an aspect of the invention.

FIG. 6 illustrates another embodiment of a system for movably attaching a device 10 to a substrate 20 in accordance with an aspect of the present invention. In this illustrated embodiment, device 10 is movably attached to substrate 20 and disposed between two spaced-apart retainers 330 and 340 defining gaps 350 and 360. Retainers may be operably attached to the substrate with at least a part of the retainer disposed over the device. For example, retainers may include an inner surfaces 335 and 345 substantially parallel to surfaces 13 and 14 of device 10, a lower surface 338 and 348 of the retainers may be in contact with and attached to the surface 22 of substrate 20 or operably attached to the substrate. Gaps 350 and 360 are defined between surfaces 13 and 14 of the device and inner surfaces 335 and 345 of the retainers.

Retainers, according to this aspect of the invention, may be attached to substrate in a variety of ways. For example, retainers may be attached to substrate using an adhesive, soldering, welding, spot welding, or via mechanical fasteners such as bolts, rivets and screws, or in any other application-appropriate way such that retainers are secured to the surface of substrate. Additionally, the use of a single piece of material, for instance a die-formed piece of metal, to retain device is contemplated as within the scope of the invention.

Figure 7:
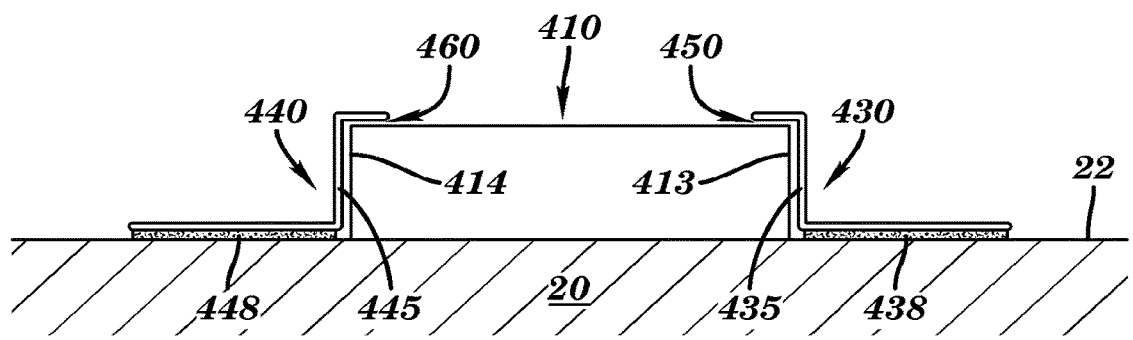
FIG. 7 is a side elevational view, in part cross-section, of another embodiment of a device movably attached to a structure in accordance with an aspect of the present invention.

FIG. 7 illustrates another embodiment of a system for movably attaching a device 410 to a substrate 20 in accordance with an aspect of the present invention. In this illustrated embodiment, device 410 has outer surfaces 413 and 414 that are perpendicular to surface 22 of substrate 20. Retainers 430 and 440 may include inner surfaces 435 and 445 substantially parallel to outer surfaces of the device, lower surface 438 and 448 of retainer may be in contact with and attached to the surface of the substrate, or operably attached to the substrate. Gaps 450 and 460 are defined between portions of the device and inner surfaces 435 and 445 of the retainers.

Figure 8:
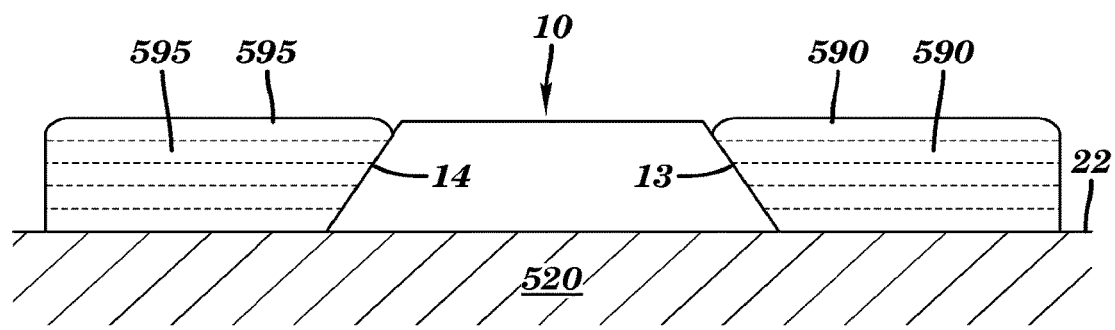
FIG. 8 is a side elevational view, in part cross-section, of another embodiment of a device movably attached to a substrate in accordance with an aspect of the present invention.

FIG. 8 illustrates another embodiment of a system for attaching a device 10 to a substrate 20 in accordance with an aspect of the present invention. According to this aspect of the invention, substrate 520 has a larger CTE than device 10. Surfaces 13 and 14 of device 10 may contact layers 590 and 595 such that temperature variations, for example, an increase in temperature, causes the substrate to expand more rapidly than the device, providing room for device to freely expand in response to changes in temperature without being constrained by the layers. Though layers 590 and 595 are used to illustrate this aspect of the invention, other material may replace layers within the scope of the invention, for example retainers or substrate, e.g., as noted above.

Figure 9:
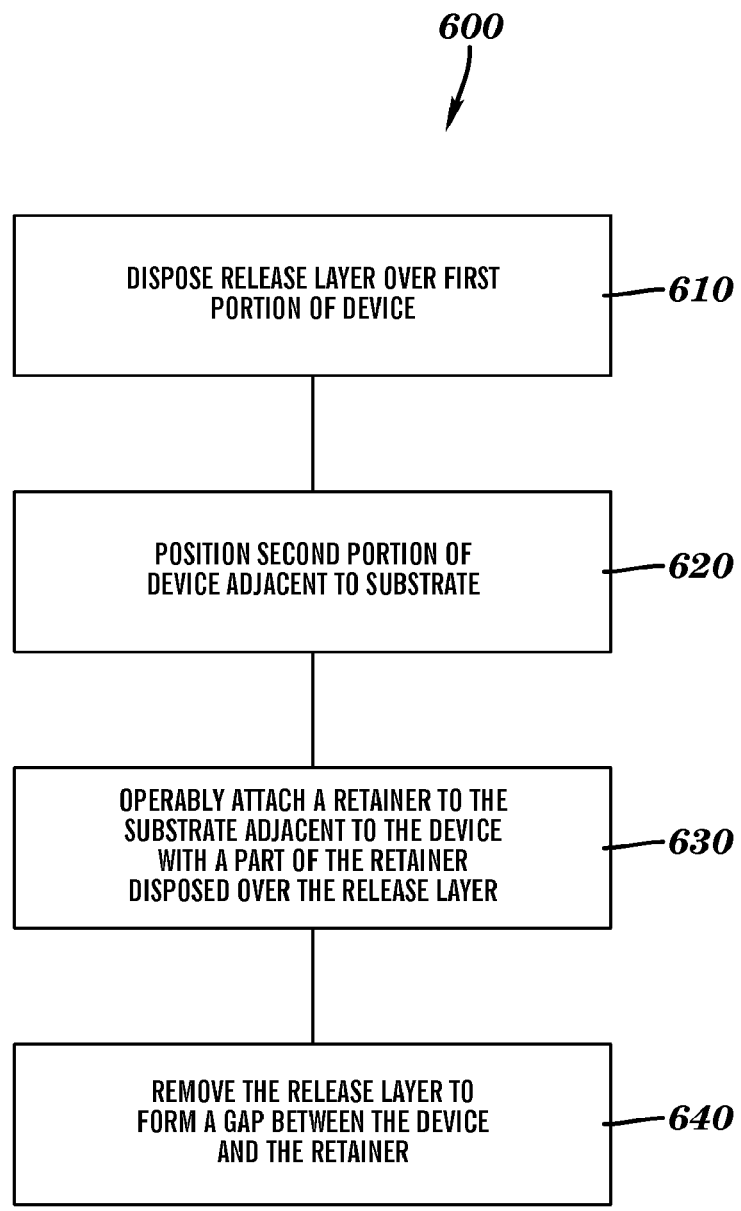
FIG. 9 is a flowchart of one embodiment of a method for movably attaching a device to a substrate in accordance with an aspect of the present invention.

FIG. 9 illustrates one embodiment of a process or method 600 for attaching a device to a substrate, the method including the steps of disposing, at 610, a removable material over a first portion of the device, positioning, at 620, a second portion of the device adjacent to the substrate, operably attaching, at 630, a retainer to the substrate adjacent to the device with a part of the retainer disposed over the removable material, and, at 640, removing the removable material to form a gap between the device and the retainer so that the device is movably retained on the substrate and wherein the gap allows the device to move freely relative to the retainer and the substrate in response to changes in temperature.

Figure 10:
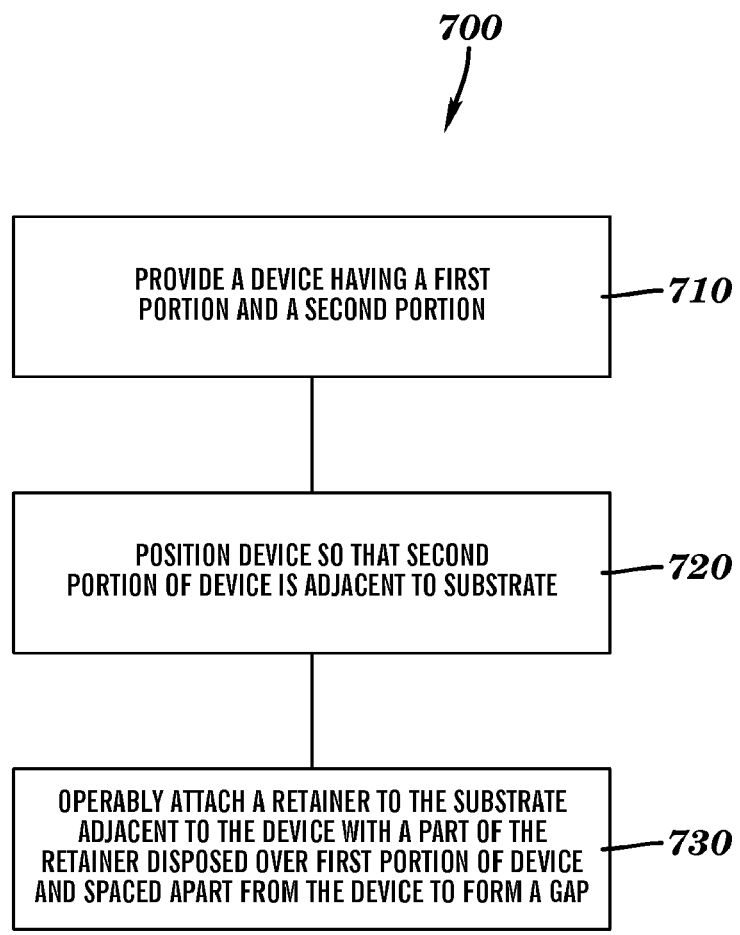
FIG. 10 is another flowchart of a method for movably attaching a device to a substrate in accordance with an aspect of the present invention.

FIG. 10 depicts another embodiment of a process or method 700 for attaching a device to a substrate, the method includes the steps of providing, at 710, a device having a first portion and a second portion, positioning, at 720, device so that second portion of device is adjacent to surface of substrate, and, at 730, operably attaching a retainer to the substrate adjacent to the device with a part of the retainer disposed over the first portion of the device and spaced apart from the device to form a gap.

In the various embodiments described above, the device may be of any application-appropriate nature including an electronic or electromechanical device such as a surface acoustic wave-based sensor, a field effect transistor, an application specific integrated circuit, a microprocessor, a resistor, an inductor, a capacitor, or a microelectromechanical (MEM) or nano device. Additionally, the device may be of any suitable shape including a rectangle, a square, a circle, a triangle, or any other desired shape for a specific application of the invention. While several of the embodiments shown include two beveled edges, the beveled edges may be an optional feature and contemplated as within the scope of the invention. As used herein, the word "bevel" as used in this disclosure may refer to a chamfer surface as well as a beveled surface. The beveled edges may be bevel cut such that the edge forms an angle E relative to the surface of the substrate, with 0°<E<90°, in order to facilitate securing the device to the substrate via the retainers. The beveled edges may also be uncut edges including, for example, edges that are perpendicular to the surface of the substrate.

Substrate may be any substrate suitable for attachment of a device, for example, a circuit substrate or jet engine part. It is contemplated that the present invention will often be used in situations where the device and substrate have differing coefficients of thermal expansion (CTE). In such situations, if the device and the substrate are rigidly attached to one another and subjected to heating, or cooling, the differences in CTE will result in stresses that could damage the device or the substrate and result in attachment failure.

In the case of substrate CTE being greater than device CTE, substrate will expand at a greater rate than the device and minimal or no removable material or gap may be necessary to allow device to freely expand in response to changes in temperature without being inhibited by the retainers. In the case of the device CTE being greater than the substrate CTE, the device will expand at a greater rate than the substrate and a removable material of thickness equal to the maximum difference in thermal expansion encountered must be used to eliminate compressive stresses on the device. Thus, the removable material or gap thickness depends upon the combination of substrate, device, and range of temperature encountered, in order to accommodate the differential of expansions without damaging the device.

According to several aspects of the invention, at least two opposite sides of the device are beveled; however, the invention may also be practiced with more than two sides of the device beveled or, in the case of the device being circular, one continuous edge being beveled. It is also contemplated as within the scope of the invention that the device may have edges that are not beveled, for example, as shown in FIG. 7.

Several aspects of the invention include the use of a moldable material as a retainer. However, rigid materials may also be used as retainers and thermally sprayed retainers are also included within the scope of the present invention. Non-limiting examples of thermally sprayed materials that are within the scope of the present invention include, for example, a metal such as an alumina material or INCONEL® (nickel chromium alloy), or a ceramic material.

Figure 11:
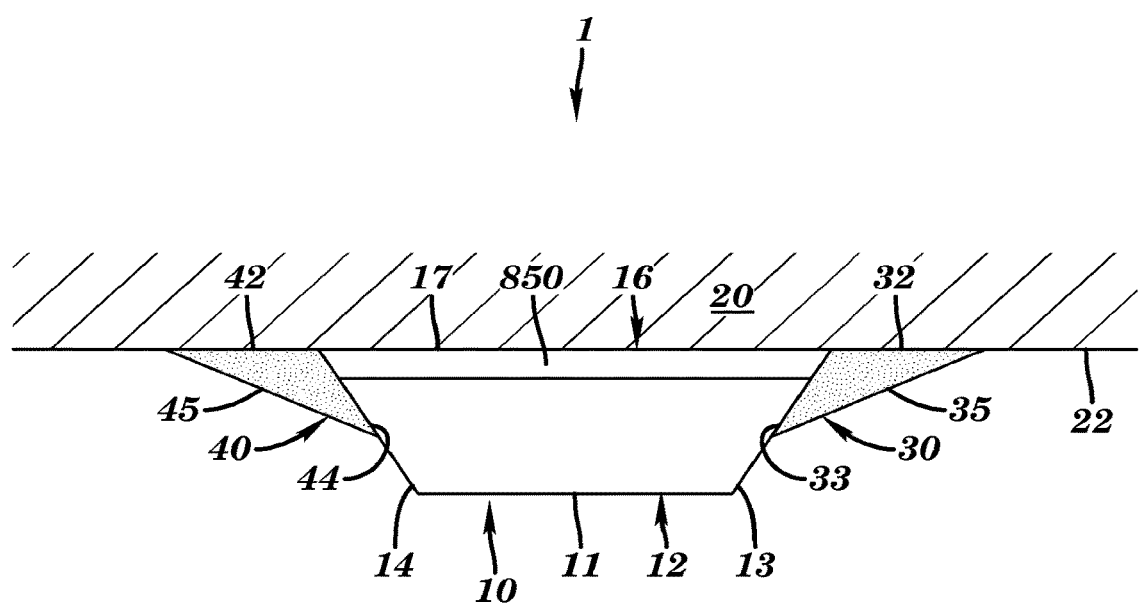
FIG. 11 is a side elevational view, in part cross-section, of another embodiment of the device shown in FIG. 1, movably attached to the substrate in accordance with an aspect of the present invention, wherein the orientation of the substrate and device are inverted to show how the device may move in such an embodiment.

From the present description, it will be appreciated that while the description and illustrations of various embodiments are shown with the device disposed or oriented on the surface of the substrate, the device may be disposed or oriented below a surface of the substrate, for example, where the retainers support the device and a gap is formed between a surface of the substrate and a surface of the device. Such an embodiment is shown in FIG. 11.

One example of a device suitable for use within the scope of the present invention is a surface acoustic wave (SAW) device. SAW devices are electronic components that generate guided acoustic waves along a surface of the device. As the acoustic waves propagate along the surface of the device, any changes to the characteristics of the propagation path affect the velocity and/or the amplitude of the surface wave. Changes in wave velocity can be monitored by measuring changes in the frequency or phase characteristics of the SAW device. The changes in frequency and phase are then correlated to a physical quantity, such as pressure or temperature for measurement, or the detection of the presence of a specific gas. The changes also may be indicative of vibration of, or strain within, the substrate upon which the device is mounted. Thus, the SAW device may be used as a sensor.

SAW sensors are sensitive devices and widely used physical and chemical sensors in liquid and gas environments because the propagating acoustic wave has its energy concentrated close to the device surface. Along an arbitrary surface wave propagation direction, a particle in the substrate material describes an elliptical trajectory, with displacement components normal and parallel to the device surface. For liquid sensor applications, any SAW device mode with a significant particle displacement component normal to the surface suffers severe attenuation, thus compromising the device performance. However, this is less of a concern for gas sensor applications, since gases generally do not excessively absorb the wave energy. Accordingly, a regular, or generalized, SAW mode may be used for gas sensor applications.

Additionally, SAW devices also may be used as delay lines and resonators in electronic systems, which may be required to operate in harsh environments that include exposure to high temperature gases.

SAW devices are typically fabricated on single crystal anisotropic substrates that are also piezoelectric, such as, for example, quartz, langasite, langatate, langanite, and gallium orthophosphate. A piezoelectric material produces electrical charges when the material is subjected to stress. Furthermore, the phenomenon is reversible. A SAW device used as a sensor to measure temperatures, pressures, or the presence of a gas, typically includes a pair of spaced apart intertwined metal inter-digital electrodes disposed upon the surface of the substrate. Each of the inter-digital electrodes sets forms a transducer. One of the transducers creates mechanical stress within the sensor substrate by applying an electric field to the crystal. The electric field is oscillatory to create a mechanical wave. Thus, the transducer converts the electrical signals applied to the device into the electromechanical surface acoustic waves that are propagated along the surface of the substrate. The other transducer converts the received mechanical wave back into an electric signal for comparison to the original signal.

As an example of the application of SAW devices, one of the changeable characteristics of the propagation path is the temperature of the surrounding medium, which may be either gas or liquid in nature. The surface wave velocities, which are determined by the orientation, or cut, of the crystalline material used to fabricate the sensor substrate, and the type of crystalline material used to fabricate the sensor substrate, are temperature dependent. Thus, it is possible to correlate the change in surface wave velocity for a SAW device to the ambient temperature of the gases or liquids surrounding the device.

The device of the present invention may include high temperature gas sensors that are of interest for the aerospace industry as a safety tool for detection of fuel leaks in jet engines, early fire detection and detection of a hostile environment. High temperature gas sensors also are needed to increase combustion efficiency of jet engines, thereby reducing travel costs and air pollution due to unburned jet fuel.

Conventionally, in high temperature applications, SAW sensors are typically mounted upon a substrate, such as an engine blade, usually with a high temperature epoxy. However, the substrate carrying the SAW sensor and the sensor material will most likely have different coefficients of thermal expansion (CTE). In this case, the differences in CTE when exposed to high temperatures may introduce unwanted stress into the sensor substrate and thereby distort the measured values. In an extreme situation, the sensor may be separated from the mounting substrate. Similar difficulties also may be encountered with other devices, both passive and active, that may be mounted upon a substrate. Additionally, harsh environments that also may cause separation include acceleration and vibration which may occur singly or in combination with high temperatures. The systems and methods of the present invention overcome these disadvantages.

Commercial applications of aspects of the present invention include any area where a device is required to be attached to a surface that is subject to environmental variables, e.g., temperature, pressure, vibration or strain, including at elevated temperatures. Some applicable areas include the aerospace, metal refining, furnace treatment, and oil well logging industries. It will be appreciated that the systems and methods of the present invention may be utilized wherever large temperature variations are expected such as between about 20° C. and about 1,500° C. and between about 20° C. and about 750° C. Such temperature variations are not limited to high temperatures, but may also apply to low temperature variation, such as about −60° C. to about 0° C., or over a normal operating range, such as about −20° C. to about 200° C. The invention also contemplates being utilized to attach an ASIC, a microprocessor or a SAW device to a substrate. The invention further contemplates being utilized to attach discrete components, such as resistors, capacitors, inductors and semiconductor devices that are included in a package having beveled edges. Additionally, the invention contemplates attaching a variety of SAW devices to a substrate to include, for example, sensors and delay lines.

While several aspects of the present invention have been described and depicted herein, alternative aspects may be effected by those skilled in the art to accomplish the same objectives. Accordingly, it is intended to cover all such alternative aspects as fall within the true spirit and scope of the invention.

The invention claimed is:

1. A method for retaining a device to a substrate, the method comprising:
    disposing a thermally or chemically removable material directly over a first portion of the device;
    positioning a second portion of the device adjacent to the substrate;
    securing a retainer to the substrate with a part of the retainer disposed over the removable material, wherein the retainer is secured adjacent to the device; and
    removing the removable material to form a gap between the device and at least one of the substrate and the retainer so that the device is freely movably retained therein, such that when the device is exposed to environments, the gap allows separation of the device from the retainer and the substrate without being constrained in response to changes in temperature.

2. The method of claim 1, wherein the first portion of the device comprises at least one beveled edge.

3. The method of claim 2, wherein the at least one beveled edge of the device forms an angle with the substrate that is greater than zero degrees and is less than 90 degrees.

4. The method of claim 1, wherein the first portion of the device comprises two beveled edges.

5. The method of claim 1, wherein the securing the retainer comprises applying a moldable material.

6. The method of claim 5, wherein the moldable material comprises at least one of an epoxy and an adhesive.

7. The method of claim 1, wherein the retainer comprises a thermally sprayed material.

8. The method of claim 1, wherein the removable material comprises a thickness of about 1-400 µm.

9. The method of claim 1, wherein the removable material comprises a thickness of about 1-10 µm.

10. The method of claim 1, further comprising operating the device and substrate at a temperature of between about 20° C. to about 1,500° C.

11. The method of claim 1, further comprising operating the device and substrate at a temperature of between about 20° C. to about 750° C.

12. The method of claim 1, further comprising operating the device and substrate at a temperature of between about −60° C. to about 0° C.

13. The method of claim 1, further comprising operating the device and substrate at a temperature of between about −20° C. to about 200° C.

14. The method of claim 1, wherein the device comprises an electronic component.

15. The method of claim 14, wherein the electronic component comprises a surface acoustic wave sensor.

16. The method of claim 1, wherein the first portion of the device comprises at least one beveled edge, the retainer comprises a moldable material, and the removable material comprises a thickness of 1-400 µm.

17. The method of claim 16, wherein the device is an electronic component.

18. The method of claim 1, wherein the retainer comprises a moldable material and the device comprises a sensor.

19. The method of claim 1, wherein the device is a piezoelectric material.

20. The method of claim 1, wherein the device is a SAW (surface acoustic wave) device.

* * * * *